United States Patent [19]
Robinson et al.

[11] Patent Number: 5,841,660
[45] Date of Patent: Nov. 24, 1998

[54] METHOD AND APPARATUS FOR MODELING PROCESS CONTROL

[75] Inventors: Jeffrey A. Robinson, Glendale; Udey Chaudhry, Mesa; Timothy L. Olson, Phoenix, all of Ariz.

[73] Assignee: Motorola, Inc., Schaumburg, Ill.

[21] Appl. No.: 603,514

[22] Filed: Feb. 20, 1996

Related U.S. Application Data

[63] Continuation of Ser. No. 344,792, Nov. 23, 1994, abandoned, which is a continuation-in-part of Ser. No. 55,895, May 4, 1993, abandoned.

[51] Int. Cl.$^6$ .............................. G06F 19/00; G06G 7/64; G06G 7/66
[52] U.S. Cl. ................ 364/468.22; 364/468.06; 364/468.07; 364/468.01; 364/468.03; 364/578
[58] Field of Search ................ 364/468, 478, 364/578, 401, 402, 403

[56] References Cited

U.S. PATENT DOCUMENTS

| | | | |
|---|---|---|---|
| 4,802,094 | 1/1989 | Nakamura et al. | 364/468 |
| 4,974,166 | 11/1990 | Maney et al. | 364/478 |
| 5,202,836 | 4/1993 | Iida et al. | 364/468 |
| 5,231,585 | 7/1993 | Kobayashi et al. | 364/468 |
| 5,455,894 | 10/1995 | Conboy et al. | 395/82 |

OTHER PUBLICATIONS

Panwalkar, S. S., Wafik Iskander, "A Survey of Scheduling Rules", Operations Research, vol. 25, No. 1, Jan. 1977.

Hancock et al; "Effects of Strategic Lot—Splittig in Various Manufacturing Environments"; 1990; pp. 432–434.

Funakoshi, K; "Process Flow System for VLSI Research and Development"; 1992; Semiconductor Manufacturing Conference.

Wang, S; Shop Floor Control in ASIC Assembly; 1991; IEEE/SEMI International Semiconductor Manufacturing Science Symposium.

Wein, LM; "Scheduling Semiconductor Wafer Fabrication"; Aug. 1988; pp. 115–130.

Toof, C.S. et al; "Manufacturing Ownership of Work–in–Process Control"; Jun. 1992; pp. 69–72.

Primary Examiner—Joseph Ruggiero
Assistant Examiner—Sheela S. Rao
Attorney, Agent, or Firm—Robert D. Atkins

[57] ABSTRACT

A method for process control which uses discrete lots in which each lot is uniquely identified. The process is modeled with a precedence rule which allows concurrent processing of each discrete lot. Lots are processed simultaneously within different processing steps in such a way as to maintain the unity of the lot while tracking the lot at all times during processing.

22 Claims, 6 Drawing Sheets

METHOD AND APPARATUS FOR MODELING PROCESS CONTROL

This application is a continuation of prior application Ser. No. 08/344,792, filed Nov. 23, 1994 abandoned, which is a continuation-in-part of Ser. No. 08/055,895, filed May 4, 1993.

RELATED APPLICATION

The present application is related to copending application entitled "CONTROL OF LOTS IN A CONTINUOUS ENVIRONMENT", Robinson et al, U.S. patent application Ser. No. 08/498,524, which application is filed on even date herewith and is included herein by reference.

BACKGROUND OF THE INVENTION

This invention relates, in general, to computer modeling, and more particularly to computer modeling of manufacturing processes.

One of the earliest uses of electronic record keeping and inventory management systems was modeling of manufacturing processes. The original motivation was derived from financial issues related to valuing inventories which continues to be of interest. As computers have become more powerful, more and more has been expected of them and accordingly expectations of the task have grown. More recently commercial systems have been available that can keep track of all lots in a manufacturing facility, account for the lot identities, contents, and locations. The most sophisticated systems actually enable paperless manufacturing, that is, tracking a lot from one location to the next with the computer telling the operator where next to send the material. Using paperless manufacturing, no "lot traveler" or "paperwork" is required to accompany each lot. The computer control system is relied upon to control and direct each operation of each lot. This is only possible because the more advanced systems contain a model of the step that the lot must undergo to complete processing. The computer system uses this model of manufacturing to ensure that steps are completed in the right order without any step being skipped.

According to the prior art, these manufacturing models are based on a discrete model of manufacturing. A discrete model is derived from a discipline called discrete control theory. Discrete control theory is a subset of control theory that uses individual and separate components to model a system; lots are discrete, individual, and separate. Manufacturing processes consist of discrete, separate steps as well. The prior art discrete modeling of manufacturing has been used for as much as 30 or 40 years. Discrete modeling has proven to be an accurate and acceptable model of the realities encountered on the factory floor. However as higher levels of automation are used, the individual lots modeled in our manufacturing facilities are beginning to behave differently. In many circumstances, processing of lots assumes a continuous nature. For example, lots can get smeared out across a section of the manufacturing line and exist simultaneously at a number of different locations within the line at the same time. This is extremely difficult to model using discrete models. The methods that have been developed to represent these types of activities are both awkward and expensive. According to the prior art, discrete and continuous manufacturing environments have been very different, and mutually exclusive, having antithetical paradigms.

In a typical advanced manufacturing operation the discrete model has broken down and become restrictive. In many cases, discrete models prohibit people from performing certain types of processing which would otherwise be desirable. The models dictate what manufacturing processes can and cannot be performed based on what can and cannot be represented accurately by the discrete models. This represents an unreasonable restriction on expensive manufacturing capacity.

According to the prior art, modeling of continuous manufacturing using discrete models has attempted to use one of two solutions. The first solution is "serialized tracking". That is, when a lot needs to exist at more than location, the lot is broken into two pieces. Each piece then assumes it own identity and proceeds independently of the material remaining in the first lot. In the extreme case where all material must flow continuously, each unit in the lot must be given a unique identity and tracked independently. When the original quantity of units in the lot is large the breakdown into individual components can result in the creation of an unacceptably large number of lots. For example, in a typical integrated circuit assembly operation with an initial configuration of 10 lots each having 600 integrated circuits, one would end up with 6,000 lots each containing one integrated circuit. Serialized tracking suffers from the deficiency that the tracking effort increases faster than the number of lots tracked. This increased tracking effort is reflected as increases in the amount of computer power, disk space, and support personnel required to keep track of the same amount of material. Very few manufacturing facilities operate at a volume which is low enough to economically consider serialized tracking.

The second prior art approach is termed the "black box approach. The black box approach simply compresses all of the steps that can occur simultaneously into a single step using the discrete model. According to this approach a lot would track into the step and be processed below the resolution of the system to track, control, or model. When completed this lot would then reappear as it tracks out of that composite step. This approach is useful enough to have encouraged development specialized "cell controller" computer systems. Cell controller computers are small computer systems designed to manage sets of equipment. This has led to the advent of "islands of automation" which have popped up throughout industry. The problem is that this results in progressively less accurate modeling together with less visibility and control as the regions of continuous manufacturing expand. There is simply no straightforward way to model all the activities occurring within the manufacturing facility. In a typical semiconductor manufacturing facility, the entire factory would have to be reduced to a single process step to use the black box approach.

There is a need to accurately model and hence to simulate both discrete and continuous processes simultaneously. This process model should be applicable to a large range of manufacturing activities that cannot be modeled according to the prior art. Such a method should represent manufacturing flows which allow lots to behave discretely or continuously and yet maintain the characteristics of both while reflecting the reality of the factory floor.

SUMMARY OF THE INVENTION

The present invention relates to a computer implemented method for modeling process tracking and control. A lot is selected for tracking where the lot has a plurality of units identified by a first lot identifier. A process model of the lot is selected from the computer. A plurality of rules of precedence is provided to control process flow. One of the plurality of rules of precedence is applied for linking a plurality of recordable process steps in the process model so that the lot resides at multiple locations in the plurality of recordable process steps while maintaining identification of the lot by the first lot identifier without splitting the lot into sublots. A database within the computer is updated to reflect the rule of precedence, The present invention further relates to an apparatus for modeling process tracking and control. A means selects a lot for tracking where the lot has a plurality of units identified by a first lot identifier. A means selects a process model of the lot from a computer. A means provides a plurality of rules of precedence to control process flow. A means applies one of the plurality of rules of precedence for linking a plurality of recordable process steps in the process model so that the lot resides at multiple locations in the plurality of recordable process steps while maintaining identification of the lot by the first lot identifier without splitting the lot into sublots. A means updates a database within the computer to reflect the rule of precedence.

The present invention further relates to a computer implemented method for modeling a semiconductor manufacturing process. A lot comprising a plurality of semiconductor devices, where the lot is identified by a first lot identifier, is processed through a plurality of process steps. A plurality of rules of precedence are provided to control process flow. One of the plurality of rules of precedence is selected to control process flow of the lot between first and second steps of the plurality of processing steps while maintaining identification of the lot comprising the plurality of semiconductor devices by the first lot identifier.

The present invention further relates to a computer implemented method of manufacturing a semiconductor device. A lot comprising a plurality of semiconductor devices, where the lot is identified by a first lot identifier, is processed through a plurality of process steps. A plurality of rules of precedence are provided to control process flow. One of the plurality of rules of precedence is selected to control process flow of the lot between first and second steps of the plurality of processing steps while maintaining identification of the lot comprising the plurality or semiconductor devices by the first lot identifier.

The present invention further relates to a computer implemented method for modeling a semiconductor manufacturing process. A lot comprising a plurality of semiconductor devices, where the lot is identified by a first lot identifier, is processed through a plurality of process steps. A start-start rule of precedence is applied in which with a first semiconductor device of the lot residing at a first step of the plurality of process steps a second semiconductor device of the lot starts a second step of the plurality of process steps while maintaining identification of the lot comprising the first and second semiconductor devices by the first lot identifier.

DETAILED DESCRIPTION OF THE DRAWINGS

Figure 1:
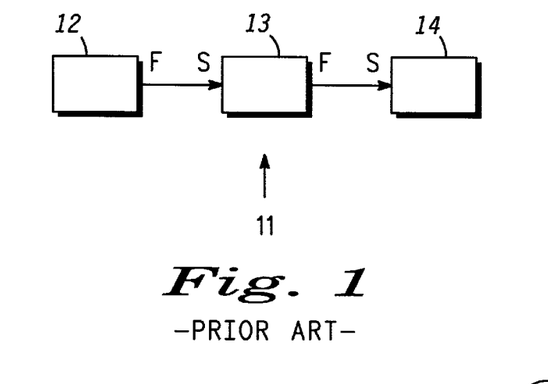
FIG. 1 shows a method for process control according to the prior art.

FIG. 1 shows a method for process control according to the prior art. A sequential process line 11 comprises a task 12, a task 13, and a task 14. Arrows between tasks 12 and 13 as well as 13 and 14 represent material flow between those tasks. For clarity the letters F and S represent the finish of one task and the start of the next. According to the prior art rule, task 12 must finish before task 13 starts and task 13 must finish before task 14 starts. This model is inadequate to describe the operation which is performed when high levels of equipment automation are used, or when parallel processing is occurring. The model for the sequential process line 11 of FIG. 1 describes a process as a network of tasks. The model for sequential process line 11 fails to comprehend the logic relationship of the links between the tasks.

Figure 2:
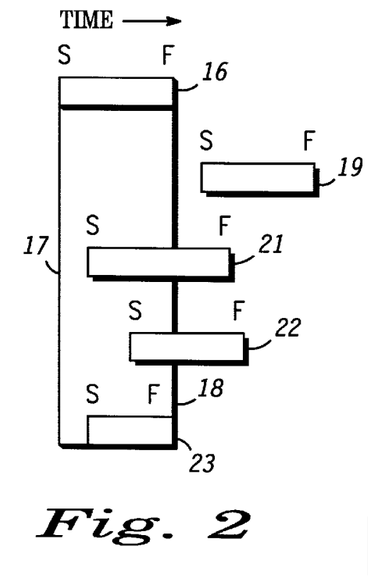
FIG. 2 shows a set of rules of precedence as an embodiment in accordance with the present invention.

FIG. 2 illustrates the operation of a set of precedence rules which describe a variety of relationships between tasks, an embodiment in accordance with the present invention. The precedence rules are summarized in Table 1 below.

TABLE 1

| Rules of Precedence | |
|---|---|
| finish/start | Specifies that one task must complete before the next can begin. |
| start/start | Specifies that the first task must start before the next step can start. |
| start/finish | Specifies that one task must start before another can finish. |
| finish/finish | Specifies that one task must finish before another can finish. |

A first task 16 is initiated at a time 17 and finishes at a time 18. For clarity these time lines are extended to illustrate the relationship of these times with other tasks. A second task 19 may only start after time 18, when task 16 finishes. This is called a finish-start relationship. A task must finish before the next can start. An example of such a rule is two tasks performed in the typical integrated circuit assembly line, die bonding and wire bonding. The die bonding task bonds individual die to a package. The second task is wire bonding in which wires are bonded to the die and to the package pins so as to electrically connect the die to the package pins. The lot stays together until all of it is finished and the lot tracks out of the die bonding task. Because of this rule the lot cannot start the next until the first task is finished. Then and only then does the lot proceed all together to the wire bonding task.

A third task 21 may be started at any time after first task 16 starts at time 17. Accordingly the relationship between first task 16 and third task 21 is termed a start-start relationship. A start-start relationship allows concurrent processing without constraining the termination of either task. This rule models continuous manufacturing. A lot containing a plurality of parts is tracked into the die bonding task. Before the lot completes the die bonding task some of the material in the lot is sent ahead to the wire bonding step Now the lot exists at two locations at once. Sometime later the lot may complete the die bonding task and track out at that location, the lot now only exists at the wire bonder. Finally the lot tracks out of the wire bonding step. Concurrent processing avoids having material wait for a task to finish before starting the next task.

A fourth task 22 is related to first task 16 in that task 22 must start before first task 16 may finish. This is termed a start-finish relationship. A start-finish relationship allows parallel processing within a lot. For example, task 22 could need to warm up test equipment and begin ramp up of a temperature test before you can track material out of the task 16. If material is sent before the temperature ramp begins, the tester will not be ready to process the material when the material arrives. As a result task 22, operation of the tester, must begin before task 16, the material handler, can finish.

A fifth task 23 is related to first task 16 in that fifth task 23 must finish before first task 16 finishes at time 18. This is termed a finish-finish relationship. A finish-finish relationship allows a non-ordered processing. For example a process requires four different operations: marking, inspection, sample test and QA check. Marking, inspection, and sample test can occur in any order. The QA check must be last since it checks that the previous steps were all done. Accordingly the QA check has a finish-finish relationship with marking, inspection, and sample test.

Figure 3:
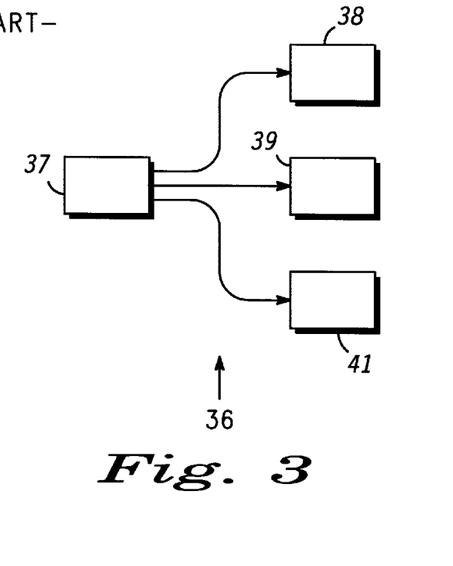
FIG. 3 shows a divergent rule or multiplicity as an embodiment in accordance with present invention.

FIG. 3 shows a divergent rule of multiplicity as an embodiment in accordance with the present invention. Table 2, below, summarizes the rules of multiplicity.

TABLE 2

Rules of Multiplicity

| | |
|---|---|
| one-to-one (1:1) single step rules of | Links a single processing step with any other using one of the precedence. |
| one-to-many (1:M) one | Links one step with more than one following step using or more of the rules of precedence. |
| many-to-one (M:1) precedence. | Links many independent steps with a single following step using one or more of the rules of |

A set of tasks 36 are arranged according to a divergent rule of multiplicity as a preferred embodiment in accordance with the present invention. A task 37 can supply material to any one of tasks 38, 39, or 41. An example of this relationship is an expensive facility such as a furnace which is then used to supply material to several identical, less expensive, machines when the material is finished in the furnace.

Figure 4:
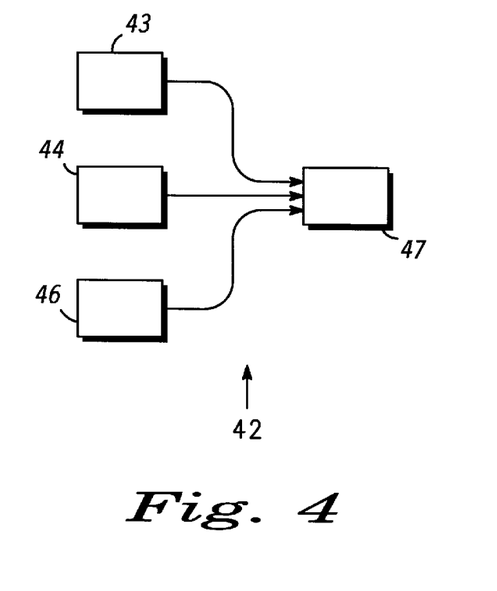
FIG. 4 shows a convergent rule of multiplicity as an embodiment accordance with the present invention.

FIG. 4 shows a set of tasks 42 arranged in a convergent rule of multiplicity as an embodiment in accordance with the present invention. Any one of tasks 43, 44, or 46 may supply material to task 47. For example, many lathes may supply material to a single heat treating furnace.

Whenever a one to many or many to one relationship exists, divergent or convergent links must have a logical trigger that describes whether the multiple paths are related by AND or OR relationships. The AND and OR relationships can be programmed within a conventional computer using logic.

The rules of multiplicity and the rules of precedence can be combined to accurately model twelve typical manufacturing process flows. Table 3 summarizes the matrix which results from combining these rule sets.

TABLE 3

Matrix of Multiplicity Rules and Precedence Rules

| | 1:1 | 1:M | M:1 |
|---|---|---|---|
| F-S | sequential processing | alternate, binning sorting, splits processing | convergent merges |
| S-S | concurrent processing | concurrent binning alternate, sorting | concurrent convergent processing |
| F-F | concurrent processing | non-ordered processing | non-ordered processing |
| S-F | concurrent processing | parallel processing | complex parallel |

Figure 5:
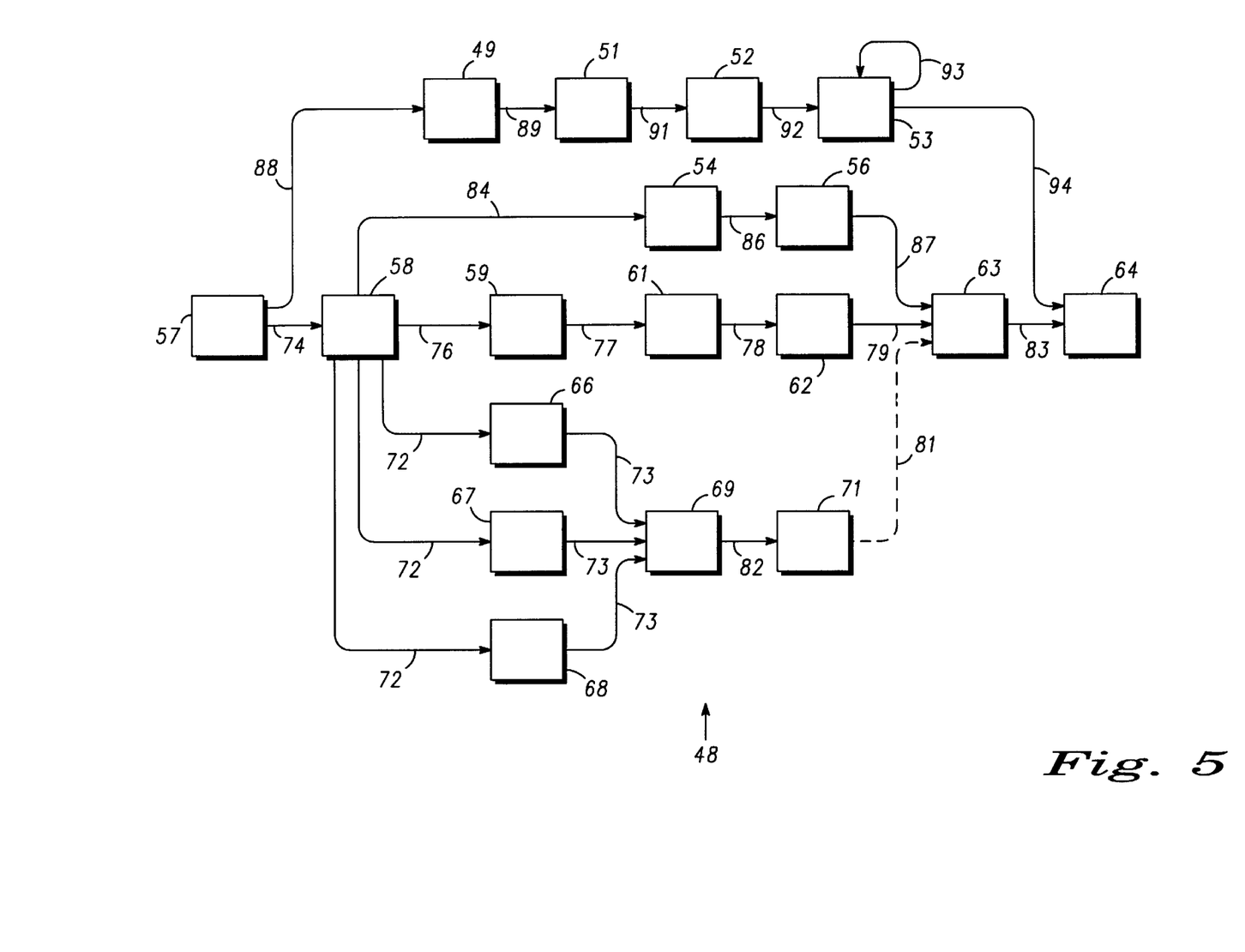
FIG. 5 shows a network of tasks in processing steps typical of a modern factory as an embodiment in accordance with the present invention.

FIG. 5 shows a network of tasks 48 as an embodiment in accordance with the present invention. Network of tasks 48 represents the typical diversity of combinations between rules of multiplicity and rules of precedence found in a manufacturing situation. A task 57 initiates a task 58 according to the finish-start rule with a link 74. Link 74 represents simple sequential processing in which one task follows another in sequence upon completion of the earlier task using the finish-start precedence rule. The virtual link 88, shown for clarity with a dashed line, initiates a task 49 without actual material flow taking place. All links except for virtual link 88 represent actual flow of material. Virtual link 88 is required to initiate parallel processing starting with task 49 in order to ensure that some component is ready when required later in the manufacturing process even though no material flow takes place. Virtual link 88 uses the start-finish precedence rule combined with a one-to-many rule of multiplicity, thus task 49 must be started before task 57 is finished. Task 49 then initiates concurrent processing of task 51 through link 89 using the start-start rule. Likewise task 51 initiates task 52 through link 91 and task 52 initiates task 53 through link 92 using the same rule. Task 53 is an iterative processing step in which output from task 53 is recycled within the task until some desired goal is achieved. This is shown by link 93 using the finish-start rule to initiate processing again once the previous processing has completed. An example of this type of iterative linkage is the commonly used cutting and fitting procedure used in machining parts to fit another specific part. In the example of FIG. 5, task 53 could be used to mate together the products of tasks 49, 51, and 52 during task 53.

The output from task 58 may be sent to various tasks as the next processing step. An example of this sort of split is in semiconductor processing where a semiconductor part will be die bonded and cleaned and then sent to one of a variety of wire bonding machines. In this case links 84, 76, and 72 all use the finish-start rule since the output of task 58 must be completed before a decision can be made as to which of the following tasks should be used. For example a high output automated wire bonder could be used in task 54 and initiated by link 84. Task 56 finishes the process steps for this path, supplying material to task 63. If the machinery necessary for task 54 is busy, then link 76 could be used to initiate tasks 59, 61, and 62 achieving the same purpose. In this case, sequential processing is required so that links 76, 77, 78 and 79 use a finish-start rule to ensure sequential processing. Alternatively, task 58 could use one of links 72 to initiate one of tasks 66, 67, or 68. This example is typical of the situation where several equivalent wire bond machines could be used to do the same task but may have different availability schedules or may take different lengths of time to do the same work. Tasks 66, 67, and 68 represent a non-ordered parallel processing in which equivalent tasks are performed in parallel on the same lot at the same time without necessarily being constrained to finish at the same time.

Task 69 is linked to tasks 66, 67, and 68 by a link 73. In this example link 73 uses a many-to-one multiplicity rule combined with a finish-finish rule of precedence, thus assuming that task 69 requires components from each of task 66, 67, and 68 in order to complete. The output of task 69 is passed to task 71 by a sequential processing link 82 using a one-to-one multiplicity rule. Task 63 accepts input from any of tasks 56, 62, or 71 using a finish-start rule. An example of this type of many-to-one convergence is where the parts output by task 56, 62, or 71 all require heat treating in a furnace which is utilized by task 63. Accordingly parts are fed into the furnace in whatever order they arrive from the preceding tasks. Task 64 accepts parts from task 63 through a sequential finish-start link 83 and from task 53 through a finish-finish link 94. An example of task 64 is an assembly process where parts are assembled into a unit from many different sources through the manufacturing process.

Figure 6:
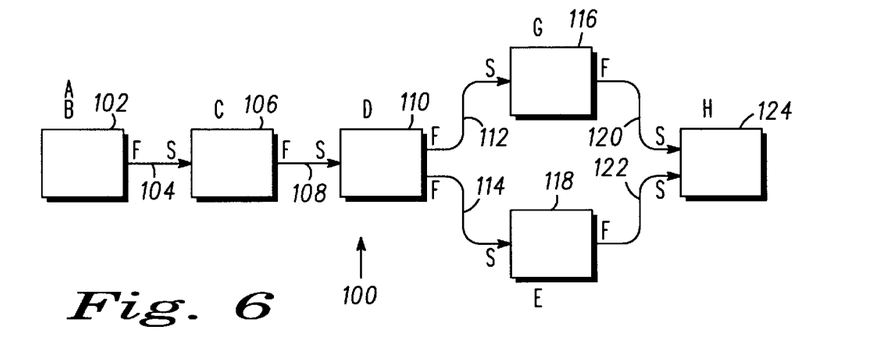
FIG. 6 shows a network of tasks exhibiting a finish-start rule of precedence.

Referring now to FIG. 6, model 100 of a process flow is shown in relation to a sequence of process steps using the finish-start rule of precedence, see Table 1. FIG. 6 also represents the discrete flow of several lots of manufacturing material through a sequence of process steps. Process step 102 is linked to process step 106 by rule of precedence 104. Process step 106 is linked to process step 110 by rule of precedence 104. Process step 110 is linked to process step 116 by rule of precedence 112 and is linked to process step 118 by rule 114. Process step 116 is linked to process step 124 by rule of precedence 120. Process step 118 is linked to process step 124 by rule of precedence 122. Tracking rules of precedence 104, 108, 112, 114, 120, and 122 are finish-start rules. The finish-start rule specifies that one process step must be complete before the next process step can begin. Model 100 is a representation of a discrete manufacturing process flow. Due to the constraints of the finish-start rule of precedence, a lot is restricted to be at one process step until the entire lot has completed the process step. For example, lots A and B reside at process step 102. Lots C, D, E, G, and H reside at process steps 106, 110, 118, 116, and 124 respectively. Using the finish-start rule of precedence prohibits a lot from existing at two locations.

For example, if process steps 116 and 118 were wirebond process steps, lot D would have to be split into two distinct lots and tracked as two distinct lots to permit processing of the original lot D concurrently at process steps 116 and 118. In a discrete sequential model, a single lot may not be processed at two different process steps at the same time. In FIG. 6, where lot A and lot B are shown at process step 102, either lot A or lot B would be held in a queuing process step while the other lot is processed through process step 102.

Figure 7:
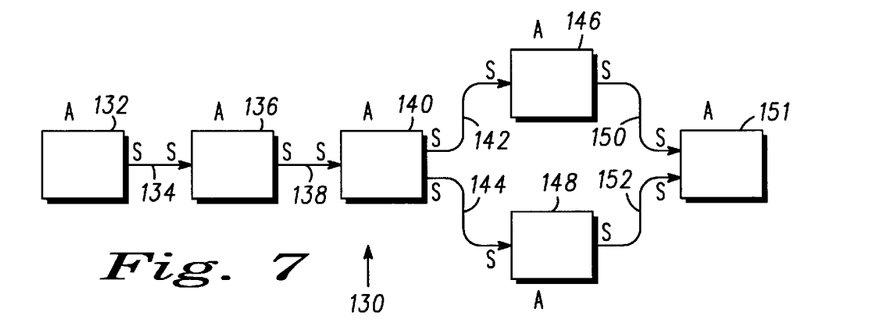
FIG. 7 shows a network of tasks exhibiting a start-start rule of precedence in accordance with the present invention.

Looking now at FIG. 7, model 130 of a process flow is shown in relation to a sequence of process steps using the start-start rule of precedence, see Table 1. FIG. 7 also represents the continuous flow of lot A of manufacturing material through a sequence of process steps. Lot A resides at several different process steps at the same time. Process step 132 is linked to process step 136 by rule of precedence 134. Process step 136 is linked to process step 140 by rule of precedence 134. Process step 140 is linked to process step 146 by rule of precedence 142 and is linked to process step 148 by rule 144. Process step 146 is linked to process step 154 by rule of precedence 150. Process step 148 is linked to process step 154 by rule of precedence 152. Tracking rules of precedence 134, 138, 142, 144, 150, and 152 are start-start rules. The start-start rule specifies that the first task must start before the next process step can start. In FIG. 7, using the one to one rule of multiplicity of Table 2, along with the start-start rule of precedence for rule of precedence 134 of Table 1, allows concurrent processing of lot A at process step 132 and process step 136.

As an advantage of the present invention, the start-start rule permits a single lot to be processed in a continuous manner with a lot residing at different process steps at the same time. To provide for a lot to be processed at two different process steps at the same time using the start-start rule requires a modification of the database or tracking system used to monitor the lot.

Figure 8:
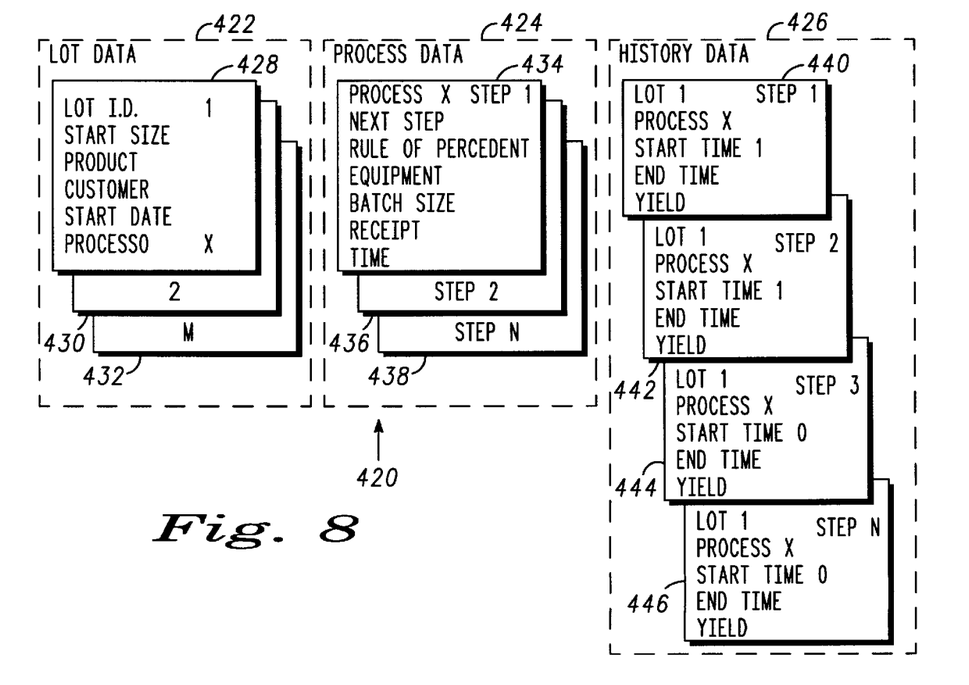
FIG. 8 shows a computer tracking implementation in accordance with the present invention.

Referring to FIG. 8, database 420 is shown. Database 420 tracks continuous process flows, as well as mixed discrete-continuous process flows. Database 420 can be programmed with software in a conventional computer. The conventional computer has a processing unit, memory, and logic functions. Database 420 includes lot data 422, process data 424, and history data 426. Lot data records 428, 430, and 430 each include a number of lot data fields that contain data that is characteristic of a given lot traveling through manufacturing processes. Data fields include data such as lot identification, lot start size, product name, customer, lot start date, and lot process. Individual unit identification is not recorded within lot data records 428, 430, and 432. Lot data records 428, 430, and 432 are recorded within database 420 for lots beginning with lot 1 and ending with lot M.

Referring further to FIG. 8, process data 424 includes data that is related to the manufacturing process through which the product flows. Process data records 434, 436, and 438 include a number of process data fields that include process name, next step of the process, rule of precedence used for next process step, equipment to be used in the present process step, batch size, present process recipe, and time required for the process. For example, to invoke a parallel process flow in which units from one lot are processed in parallel on two pieces of equipment, process data record 434 would specify the next process step along with two equipments that were capable of performing the required process step. Individual unit identification is not recorded within process data records 434, 436, and 438. Process data is entered as a record for each process step where the first process step is step 1 and the last process step is step N.

Again referring to FIG. 8, history data 426 includes data that is related to the history of lots and to the history of the manufacturing processes through which the lots flow. History data records 440, 442, 444, and 446 include a number of history data fields that include lot number, process name, start time of the process step, end time of the process step, and yield. Individual unit identification is not recorded within history data records 440, 442, 444, and 446, however, data is accumulated in a history record for all units from a lot that pass through the process step. For example, yield is tabulated in a cumulative manner as units from a lot pass through several process steps. If ten units from a lot of twenty units pass through a process step 1 on a first piece of equipment, the accumulated number of good units, units surviving process step 1, of the ten units is recorded in history data record 440. If a second ten units from the lot is processed on a second equipment the number of good units is again recorded in history data record 440 in a cumulative manner. The resultant yield for the lot of twenty units is easily computed using a conventional computer. The yield is calculated by addressing history data record 440 for step 1 and simultaneously addressing the start size of the lot from lot data record 428. Thus the yield is then computed by dividing the number of good units recorded in history data record 440 by the start size of the lot recorded in lot data record 428.

As an advantage of the present invention, the model of continuous manufacturing enables the accumulation feature of data base 420 to be realized in the manufacturing system. In prior art models, only a single step record is open at any time. In the model of the present invention, many steps may be open at the same time since alternative rules of precedence permit a lot to exist simultaneously at different steps or locations. Thus, a change is required to the lot tracking database.

In the present invention, since individual step history records overlap each other in time, different algorithms are implemented to generate reports and interpret history. In prior art models, such overlapping history records are interpreted as errors or database corruption, a forbidden condition.

Another aspect of a manufacturing data base modeled with the present invention, is that a track-in transaction occurs before the track-in quantity is determined. In the present invention, a history record is opened and the track-in time recorded when the leading edge of a lot reaches a specific process step. At that time, only a single unit of the lot may have arrived. The total quantity of units tracked in will not be determinate until the track-out of the previous step is performed.

The following example demonstrates how the location of units belonging to a lot can be located within a manufacturing system modeled with the present invention, even though units from the lots exist at several manufacturing steps concurrently. Looking again to FIG. 7, lot A starts at process step 132 and is linked to process step 136 using start-start rule of precedence 134. Since the start-start rule of precedence specifies that the first task must start before the next step can start, lot A can flow continuously between process step 132 and 136 and units from lot A can exist concurrently at process steps 132 and 136. Rule of precedence 138 links process step 136 with process step 140. Rule of precedence 138 is a start-start rule. Thus, it is possible for units from lot A to exist at process step 140 concurrently with units at process steps 132 and 136. However, for this example, it is assumed that units from lot A are present at process steps 132 and 136 but that no units from lot A have reached process step 140. Looking back to FIG. 8, from the model of the present invention, lot data record 428 for lot A indicates that process X is used to process units from lot A. Lot A process record resides in memory of a conventional computer and can be accessed through an inquiry to the computer. The inquiry into lot data record 428 would show process X. Process X in lot data record 428 is linked to process data record 434. Process record 434 for process X would indicate that step 1 is process step 132 and that the next process step is process step 136. In a similar manner process record 436 would show that step 2 is process step 136 with the next step being process step 140. Likewise, process record 438 would indicate that step N=3 would be process step 140. Thus in the example, steps 1, 2, and 3 of FIG. 8 equate to process steps 132, 136, and 140 respectively. History data records 440, 442, and 444 are present in memory in the conventional computer of the manufacturing system. In the example, the leading edge of a lot designates the step at which it can track into a processing step. Since a leading edge unit from lot A has tracked into process step 132, history data record 440 start time is equal to one. Likewise, since a leading edge unit from lot A has tracked into process step 136, history data record 442 start time is equal to one. Since the leading edge yet tracked into process yet tracked into process step 140, history data record 444 will indicate that start time is equal to zero. To determine the locations of lot A, the conventional computer of the manufacturing system would be queried for lot A. The logic of the conventional computer, knowing lot A size and process flow X from lot data record 428, would traverse to process data records 434, 436, and 438 for process X. From process data records 434, 436, and 438, the conventional computer would then locate history records 440, 442, and 444 for lot A. Since the start times of steps 1 and 2 are equal to 1 and no end times have been recorded, and since history data record 444 indicates that a leading edge unit of lot A has not been tracked in, the computer would report that lot A is located at process steps 132 and 136 but not at process step 140.

As a result of the model for tracking and controlling lots of the present invention, individual units within the lot are not required to be identified in lot data records of the database nor do the units need to be split into separate lots. Only a single lot data record is required for each lot to be processed plus a location record for each process step of the lot at which the lot resides. Thus the present invention provides for a significant reduction in the size of memory required for a manufacturing process database for a continuous manufacturing process.

Figure 12:
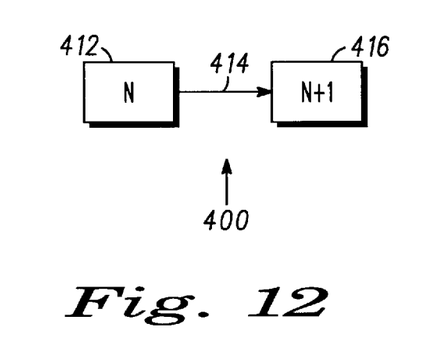
FIG. 12 shows a model of a sequence of steps in accordance with the present invention.

Referring to FIG. 12, a model of sequence of steps 410 is shown. Step 412 is connected to step 416 using rule of precedence 414. Step 416 immediately follows step 412. Rule of precedence 414 is used to link step 412 to step 416. Modeling of rule of precedence 414 can be implemented by programming software in a conventional computer. Rule of precedence 414 is defined as appropriate for the physical link that exists between step 412 and step 416. The rule of precedence 414 will be one of either finish-start, start-start, finish-finish, or start-finish.

Selecting a finish-start rule of precedence requires that associated logic for the finish-start rule of precedence be implemented. The logic is such that if a lot is tracked out of step 412, it must automatically be moved to step 416; and a lot may only be processed at a single location at one time. Thus, the finish-start rule of precedence requires that when a track-out occurs, a simultaneous track-in must also occur.

Selecting a start-start rule of precedence requires that associated logic for the start-start rule of precedence be implemented. The logic is such that if a lot exists at one or more steps, track-ins may only occur at the leading edge of the lot. If a lot exists at one or more steps, track-outs may only occur at the trailing edge of the lot, which is the lowest number of step at which the lot resides. At any given step, track-ins to the step must occur before a track-out at the step can be performed. Track-in and track-outs may occur independently of one another. In choosing the start-start rule of precedence, it must be understood that the leading edge of the lot must remain ahead of the trailing edge of the lot. Using the start-start rule of precedence permits continuous processing within a manufacturing system.

Selecting a finish-finish rule of precedence requires that associated logic for the finish-finish rule of precedence be implemented. The logic is such that if a lot exists at one or more steps, track-ins may occur in any order. At any given step, track-ins to the step must occur before a track-out at the step can be performed. If a lot exists at one or more steps, track-outs may only occur at any location at which the lot exists, and in any order, so long as all track-outs at the previous steps are completed before track-out at the final step is performed.

Selecting a start-finish rule of precedence requires that associated logic for the start-finish rule of precedence be implemented. The logic is such that if a lot exists at step 412, a track-in must occur at step 416 before the track-out at step 412 may be performed. At any given step, track-ins to the step must occur before a track-out at the step can be performed.

The tracking rules of precedence are implemented in logic within software on a conventional computer. Because of the introduction of different tracking rules of precedence between steps, different logical rules apply to the relationship of track-ins and track-outs at different steps. The tracking rules of precedence are determined from process definition records and then the appropriate tracking rules of precedence regarding track-ins and track-outs are applied to the model for tracking and controlling lots for the manufacturing process. The software for implementing the tracking rules of precedence within the model for tracking and controlling lots within the manufacturing process may take the form of, but not limited to, if-then statements. For example, "If rule=start-start, then logic=logic for rule start-start" where the logic for the rule is as defined above.

Figure 9:
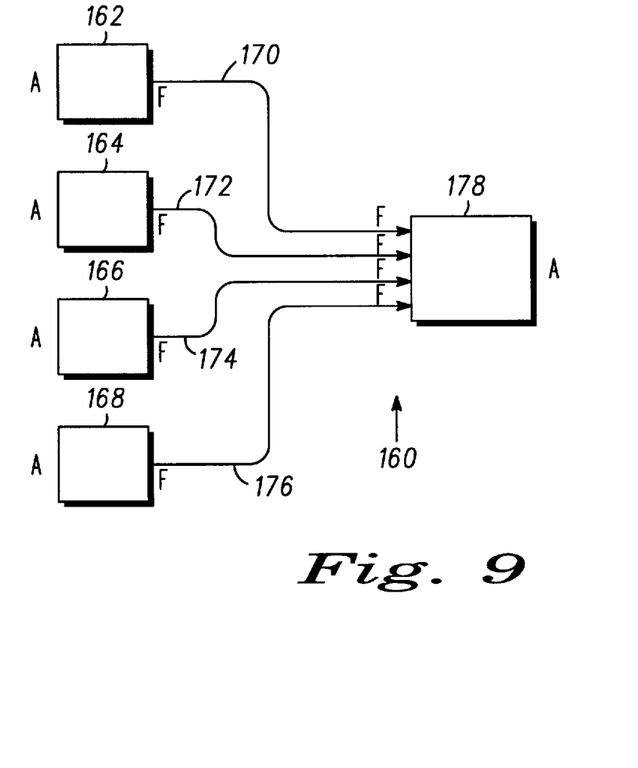
FIG. 9 shows a network of tasks exhibiting a finish-finish rule of precedence in accordance with the present invention.

Turning now to FIG. 9, model 160 of a process flow is shown in relation to a sequence of process steps using the finish-finish rule of precedence, see Table 1. FIG. 9 also represents the continuous flow of lot A of manufacturing material through a sequence of process steps. FIG. 9 is an example of non-ordered processing, in which a many to one rule of multiplicity is applied. Lot A resides at several different process steps at the same time. Process step 162 is linked to step 178 by rule of precedence 170. Process step 164 is linked to step 178 by rule of precedence 172. Process step 166 is linked to step 178 by rule of precedence 174. Process step 168 is linked to step 178 by rule of precedence 176. Tracking rules of precedence 170, 172, 174, and 176 are finish-finish rules. In model 160, lot A processing may be initiated at any of process steps 162, 164, 166, or 168. Lot A processing may finish processing steps 162, 154, or 168 in any order. However, all of process steps must be completed prior to process step 178 being completed. As an example, model 160 represents a model of a final outgoing process. Process step 162 is an inspect process step, process step 164 is an autoclave process step, process step 166 is a pack process step, process step 168 is a QA process step, and process step 178 is a ship process step. Thus, following the finish-finish rule of precedence, units from lot A may enter into any of process steps 162, 164, 166, or 168 in any order. Units from lot A may finish any of process steps 162, 164, 166, or 168 in any order. However, all units from lot A entering process steps 162, 164, 166, or 168 must finish process steps 162, 164, 166, or 168 before the units of lot A are shipped at process step 178. As an advantage of the present invention, the finish-finish rule of precedence the definition of several independent steps that need to be completed before subsequent processing can continue and the finish-finish rule of precedence permits the steps to be performed in any order. This form of non-ordered processing is not possible to model in present modeling methods.

Figure 10:
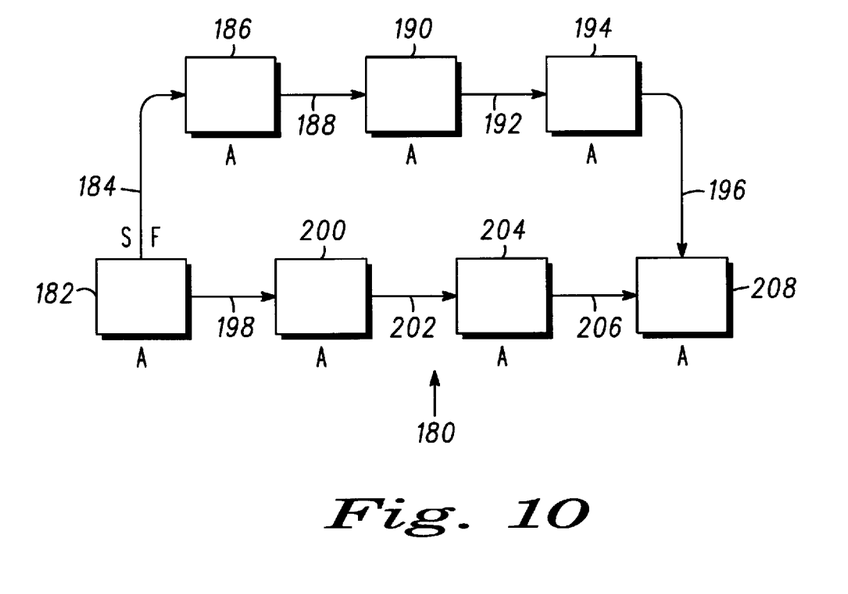
FIG. 10 shows a network of tasks exhibiting a start-finish rule of precedence in accordance with the present invention.

Referring to FIG. 10, model 180 of a process flow is shown in relation to a sequence of process steps using the start-finish rule of precedence, see Table 1. FIG. 10 also represents the continuous flow of lot A of manufacturing material through a sequence of process steps. Process step 182 is linked to process step 200 by rule of precedence 198. Process step 200 is linked to process step 204 by rule of precedence 202. Process step 204 is linked to process step 208 by rule of precedence 206. Process step 182 is linked to process step 186 by start-finish rule of precedence 184. Process step 186 is linked to process step 190 by rule of precedence 192. Process step 190 is linked to process step 194 by rule of precedence 198. Process step 194 is linked to process step 208 by rule of precedence 196. Process step 186 must start before process step 182 is completed due to start-start rule of precedence 184 linking process step 182 to process step 186. For example, process step 182 reflects metal mask alignment for an integrated circuit wafer. Process steps 182, 200, and 204 are related to the photomask process for the integrated circuit wafer. Process steps 186, 190, and 194 relate to the setup of the acid bath in which the integrated circuit wafer will be immersed to perform a metal etch process. It is desirable to use a fresh acid bath to etch the integrated circuit wafer. The sum of the cycle times of process steps 186, 190, and 194 is approximately equal to the sum of the cycle times of process steps 182, 200, and 204. Therefore, the optimal preparation of the acid bath begins only when lot A actively resides at, but has not completed, the mask alignment step which is process step 182. Thus, the start-finish rule of precedence 184 assures that the acid bath will be optimal when the integrated circuit wafer reaches the etch process step which is process step 208.

Figure 11:
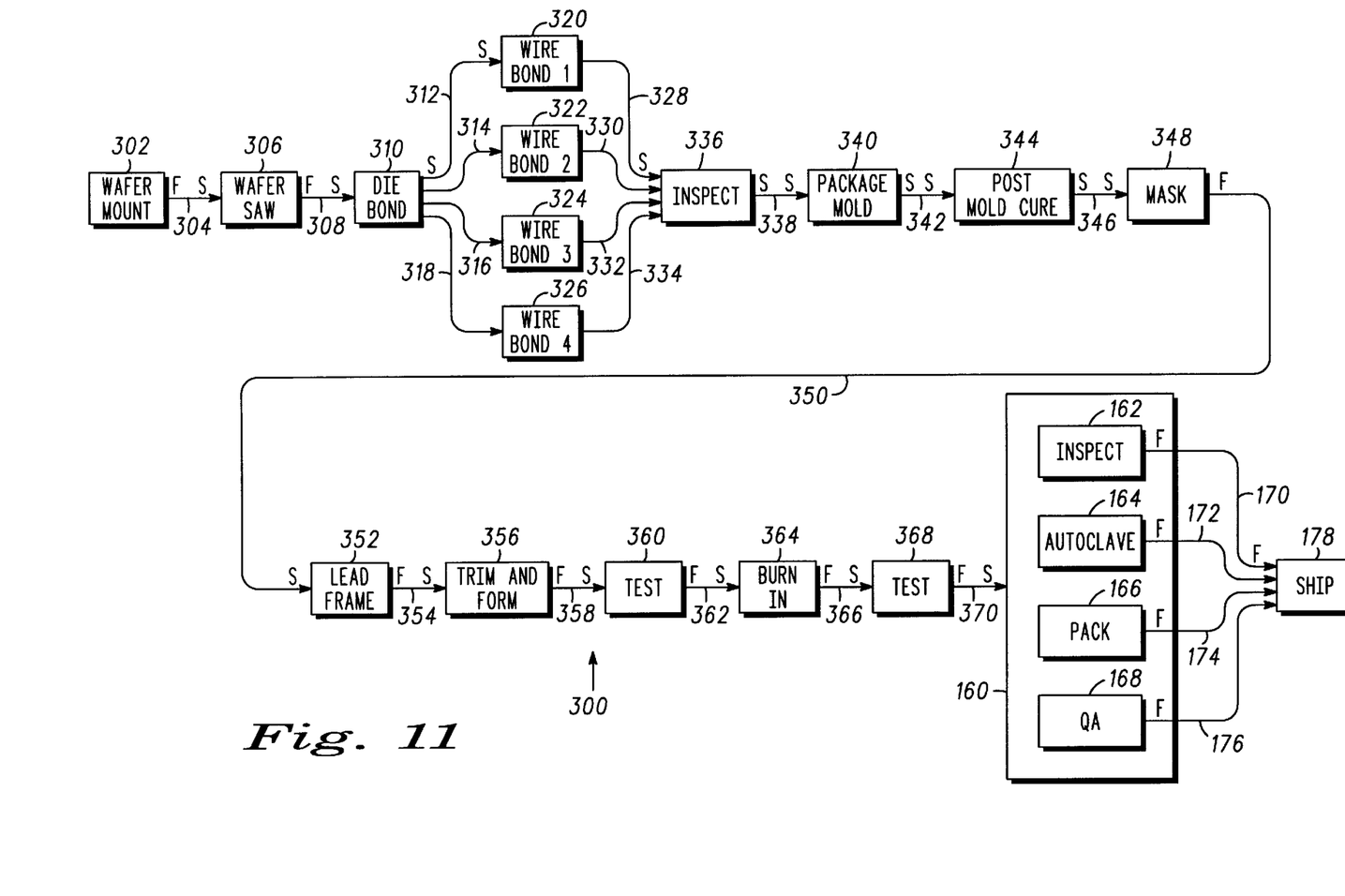
FIG. 11 shows an integrated circuit manufacturing flow in accordance with the present invention.

Referring now to FIG. 11, integrated circuit manufacturing flow 300 is shown as modeled using the embodiments of the present invention. Wafer mount 302, wafer saw 306, die bond 310, wirebond 320, wirebond 322, wirebond 324, wirebond 326, inspect 336, package mold 340, post mold cure 344, mark 348, lead plate 352, trim and form 356, test 360, burn-in 364, test 368, inspect 162, autoclave 164, pack 166, QA 168, and ship 178 are process steps. Wafer mount 302 is linked to wafer saw 306 with finish-start rule of precedence 304, wafer saw 306 is linked to die bond 310 with finish-start rule of precedence 308. Thus, process steps wafer mount 302 through die bond 310 are modeled as a discrete sequential flow as described in Table 3.

Die bond 310 is linked to wirebond 320, wirebond 322, wirebond 324, and wirebond 326 with finish-start rules of precedence 312, 314, 316, and 318 respectively using a one to many rule of multiplicity. Thus, the diebond, wirebond processes are modeled as concurrent processes.

Wirebond 320, wirebond 322, wirebond 324, and wirebond 326 are linked to inspect 336 with start-start rules of precedence 328, 330, 332, and 334 respectively using a many to one rule of multiplicity. Wirebond, inspect processes are modeled as concurrent convergent continuous processes.

Inspect 336 is linked to package mold 340 with rule of precedence 338. Package mold 340 is linked to post mold cure 344 with rule of precedence 342. Post mold cure 344 is linked to mark 348 with rule of precedence 346. Rules of precedence 338, 342, and 346 are start-start rules permitting units from the same lot of material to be spread across several process steps. Therefore, inspect 336 through mark 348 are modeled as concurrent continuous processes.

Mark 348 is linked to lead plate 352 with rule of precedence 350. Lead plate 352 is linked to trim and form 356 with rule of precedence 354. Trim and form 356 is linked to raw stock test 360 with rule of precedence 358. Test 360 is linked to burn-in 364 with rule of precedence 362. Burn-in 364 is linked to final test 368 with rule of precedence 366. Final test 368 is linked to final outgoing process 160 with rule of precedence 370. Rules of precedence 354, 358, 362, 366, and 370 are finish-start rules of precedence. Process steps lead plate 352 through final test 368 represent a model of discrete sequential processing.

Inspect 162 is linked to ship 178 by rule of precedence 170. Autoclave 164 is linked to ship 178 by rule of precedence 172. Pack 166 is linked to ship 178 by rule of precedence 174. QA 168 is linked to ship 178 by rule of precedence 176. Tracking rules of precedence 170, 172, 174, and 176 are finish-finish rules. In final outgoing 160, lot A processing may be initiated at any of process steps 162, 164, 166, or 168. Lot A processing may finish processing steps 162, 154, or 168 in any order. However, all of process steps must be completed prior to process step 178 being completed. Therefore, the model of final outgoing process 160 and ship 178 are modeled as a non-ordered concurrent continuous process.

Figure 13:
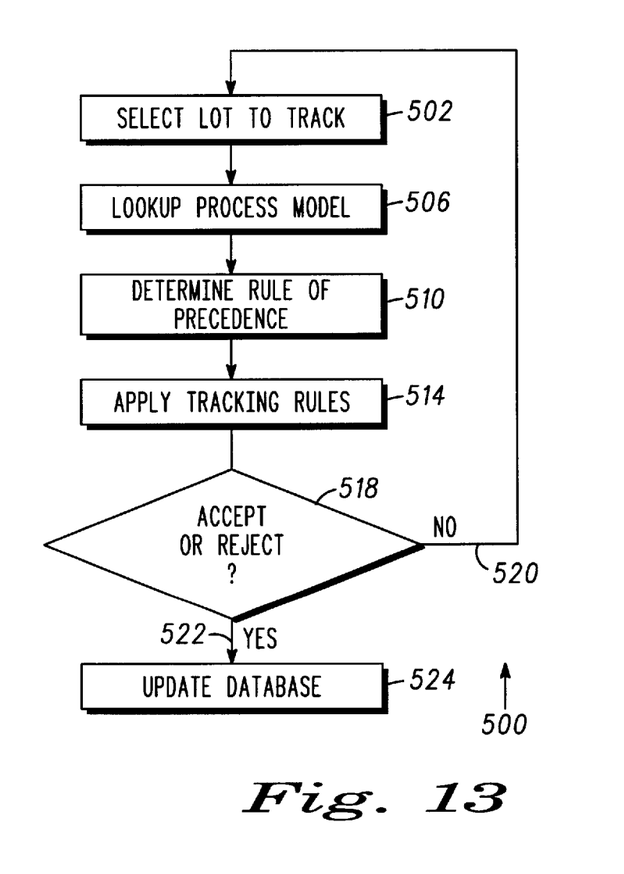
FIG. 13 shows a computer flow implementation of the present invention.

A tracking and controlling model for integrated circuit manufacturing flow 300 can be implemented using computer flow diagram 500 of FIG. 13. Computer flow diagram 13 can be used to derive tracking and controlling manufacturing models for other types of manufacturing flows as well. Referring now to FIG. 13, computer flow diagram 500 can be exercised with software in a conventional computer. The first step of computer flow diagram 500 is "select lot to track" 502, which is a track-in transaction or a track-out transaction. The lot to track may be selected from the lot record section of the database of the conventional computer.

The second step of computer flow diagram 500 is "lookup process model" 506. The process model is found in the process record section of the database of the conventional computer. The order of steps in a manufacturing process is dictated by the manufacturing process itself.

The third step in implementing the tracking and controlling model is "determine rule of precedence" 510. The rules of precedence are programmed within the logic section of the conventional computer. Additionally, rules of multiplicity are programmed within the logic section of the conventional computer. The rules of precedence, along with the rules of multiplicity define the way a lot behaves between process steps in the model of the tracking and controlling system. The rules of precedence include start-start, start-finish, Finish-start, and finish-finish. The rules of multiplicity include one to one, one to many, and many to one.

The fourth step in computer flow diagram 500 is "apply tracking rules" 514. The tracking rules are located in logic in the conventional computer. The tracking rules can be implemented with "if-then" logic statements that are used with the rules of precedence. The logic statements are different for each rule of precedence.

The fifth step in computer flow diagram 500 is a decision point to "accept or reject" 518 the attempted transaction, which is track-in or track-out. If a decision is made to accept the transaction, which is the attempt to track-in or track-out, the "yes" branch of computer flow diagram 500 is directed toward "update data base" 524, the sixth step of computer flow diagram 500. Updating the database includes modifying the format of history data records in the database to define parameters such as process step relationship to process equipment. Additionally, location records may be generated to facilitate lot tracking within the tracking and controlling model. If the database is hierarchical in nature, an array of locations may be assigned to the model for tracking and controlling. If the database is relational, a pointer in a history record would be directed toward a table location in the model for tracking and controlling. The database is modified dependent upon the needs defined by the model for tracking and controlling.

If at step five, "accept or reject" 518, the decision is a "no" 520, the decision branch is directed back to the first step, "select lot to track" 502, of computer flow diagram 500.

If the tracking and controlling model is rejected for a lot, the sequence of steps defined in the manufacturing flow for the lot cannot be modeled and another lot is selected and the process of computer flow diagram is repeated.

By now it should be clear that the present invention provides a method to accurately model and hence to simulate both discrete and continuous processes simultaneously. The process model is applicable to a large range of manufacturing activities that could not be modeled accurately according to the prior art. The method of modeling represents typical manufacturing flows which allows lots to behave either discretely or continuously according to the requirements of the manufacturing process and yet maintains the characteristics of both types of flow while reflecting the reality of the factory floor.

We claim:

1. A computer implemented method for modeling process tracking and control, including the steps of:

selecting a lot for tracking where said lot has a plurality of units identified by a first lot identifier;

selecting a process model of said lot from the computer;

providing a plurality of rules of precedence to control process flow;

applying one of the plurality of rules of precedence for linking a plurality of recordable process steps in said process model so that said lot resides at multiple locations in said plurality of recordable process steps while maintaining identification of said lot by said first lot identifier without splitting said lot into sublots; and updating a database within the computer to reflect said rule of precedence.

2. The computer implemented method of claim 1, further including the steps of:

applying a rule of multiplicity for linking said plurality of process steps in said process model; and updating said database within the computer to reflect said rule of multiplicity.

3. The computer implemented method of claim 1, wherein said step of applying a rule of precedence includes the step of selecting a start-start rule.

4. The computer implemented method of claim 3 further including the steps of:

applying a one to many rule of multiplicity for linking said plurality of process steps in said process model; and updating said database within the computer to reflect said one to many rule of multiplicity.

5. The computer implemented method of claim 3 further including the steps of:

applying a one to one rule of multiplicity for linking said plurality of process steps in said process model; and updating said database within the computer to reflect said one to one rule of multiplicity.

6. The computer implemented method of claim 3 further including the steps of:

applying a many to one rule of multiplicity for linking said plurality of process steps in said process model; and updating said database within the computer to reflect said many to one rule of multiplicity.

7. The computer implemented method of claim 1, wherein said step of applying a rule of precedence includes the step of selecting a start-finish rule.

8. The computer implemented method of claim 1, wherein said step of applying a rule of precedence includes the step of selecting a finish-finish rule.

9. An apparatus for modeling process tracking and control, comprising:

means for selecting a lot for tracking where said lot has a plurality of units identified by a first lot identifier;

means for selecting a process model of said lot from a computer;

means for providing a plurality of rules of precedence to control process flow;

means for applying one of the plurality of rules of precedence for linking a plurality of recordable process steps in said process model so that said lot resides at multiple locations in said plurality of recordable process steps while maintaining identification of said lot by said first lot identifier without splitting said lot into sublots; and means for updating a database within said computer to reflect said rule of precedence.

10. A computer implemented method for modeling process tracking and control, including the steps of:

selecting a lot for tracking where said lot has a plurality of units identified by a first lot identifier;

selecting a concurrent process model of said lot from the computer;

applying a start-start rule of precedence for linking a plurality of recordable process steps in said concurrent process model so that said lot resides at multiple locations in said plurality of recordable process steps while maintaining identification of said lot by said first lot identifier without splitting said lot into sublots; and updating a database within the computer to reflect said start-start rule of precedence.

11. A computer implemented method for modeling a semiconductor manufacturing process, comprising the steps of:

processing a lot comprising a plurality of semiconductor devices where the lot is identified by a first lot identifier through a plurality of process steps;

providing a plurality of rules of precedence to control process flow; and selecting one from among the plurality of rules of precedence to control process flow of the lot between first and second steps of the plurality of processing steps while maintaining identification of the lot comprising the plurality of semiconductor devices by the first lot identifier.

12. The computer implemented method of claim 11 wherein one of the plurality of rules of precedence includes starting a unit of the lot in the second step once the lot has finished the first step.

13. The computer implemented method of claim 11 wherein one of the plurality of rules of precedence includes starting a unit of the lot in the second step after having started a unit of the lot in the first step.

14. The computer implemented method of claim 11 wherein one of the plurality of rules of precedence includes finishing the lot in the first step before finishing the lot in the second step.

15. The computer implemented method of claim 11 wherein one of the plurality of rules of precedence includes starting a unit of the lot in the second step before finishing the lot in the first step.

16. A computer implemented method of manufacturing a semiconductor device, comprising the steps of:

processing a lot comprising a plurality of semiconductor devices where the lot is identified by a first lot identifier through a plurality of process steps;

providing a plurality of rules of precedence to control process flow; and selecting one from among the plurality of rules of precedence to control process flow of the lot between first and second steps of the plurality of processing steps while maintaining identification of the lot comprising the plurality of semiconductor devices by the first lot identifier.

17. The computer implemented method of claim 16 wherein one of the plurality of rules of precedence includes starting a unit of the lot in the second step once the lot has finished the first step.

18. The computer implemented method of claim 16 wherein one of the plurality of rules of precedence includes starting a unit of the lot in the second step after having started a unit of the lot in the first step.

19. The computer implemented method of claim 16 wherein one of the plurality of rules of precedence includes finishing the lot in the first step before finishing the lot in the second step.

20. The computer implemented method of claim 16 wherein one of the plurality of rules of precedence includes starting a unit of the lot in the second step before finishing the lot in the first step.

21. A computer implemented method for modeling a semiconductor manufacturing process, comprising the steps of:

processing a lot comprising a plurality of semiconductor devices where the lot is identified by a first lot identifier through a plurality of process steps; and applying a start-start rule of precedence in which with a first semiconductor device of the lot residing at a first step of the plurality of process steps a second semiconductor device of the lot starts a second step of the plurality of process steps while maintaining identification of the lot comprising the first and second semiconductor devices by the first lot identifier.

22. The computer implemented method of claim 21 further including the steps of:

providing a plurality of rules of precedence including the start-start rule of precedence to control process flow; and selecting one from among the plurality of rules of precedence to control process flow of the lot between third and fourth steps of the plurality of processing steps while maintaining identification of the lot comprising the plurality of semiconductor devices by the first lot identifier.

* * * * *